United States Patent
Budell et al.

(10) Patent No.: US 7,882,469 B2
(45) Date of Patent: Feb. 1, 2011

(54) AUTOMATIC VERIFICATION OF ADEQUATE CONDUCTIVE RETURN-CURRENT PATHS

(75) Inventors: Timothy W. Budell, Westford, VT (US); David C. Reynolds, Essex Junction, VT (US); Eric W. Tremble, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 489 days.

(21) Appl. No.: 11/945,754

(22) Filed: Nov. 27, 2007

(65) Prior Publication Data

US 2009/0138836 A1    May 28, 2009

(51) Int. Cl.
 *G06F 17/50* (2006.01)
 *G06F 9/45* (2006.01)
(52) U.S. Cl. .................... 716/5; 716/2; 716/10
(58) Field of Classification Search ......... 716/2, 716/5, 10
 See application file for complete search history.

(56) References Cited

U.S. PATENT DOCUMENTS

| | | | |
|---|---|---|---|
| 6,643,831 B2 | 11/2003 | Chang et al. | |
| 7,411,134 B1 | 8/2008 | Steinfeld et al. | |
| 2002/0104063 A1 | 8/2002 | Chang et al. | |
| 2003/0051910 A1 | 3/2003 | Dyke et al. | |
| 2004/0061577 A1 | 4/2004 | Breisch et al. | |
| 2005/0108671 A1 | 5/2005 | Becker et al. | |
| 2006/0043547 A1 | 3/2006 | Kuzmenka | |

OTHER PUBLICATIONS

Budell et al., U.S. Appl. No. 11/866,591, Office Action Communication, Aug. 12, 2009, 7 pages.

*Primary Examiner*—Jack Chiang
*Assistant Examiner*—Magid Y Dimyan
(74) *Attorney, Agent, or Firm*—Gibb I.P. Law Firm, LLC; Richard M. Kotulak, Esq.

(57) ABSTRACT

After finding the shortest conductive signal return-current path for each signal, the invention assesses whether each conductive return-current path is adequate. The method analyzes each shortest conductive signal return-current path and determines if a significant portion of the signal return current flows as displacement current rather than following the conductive current path. A significant displacement current flows when the length of the conductive return-current path that diverges from a signal net is more than a previously defined limit based on the signal transition time. Further, a significant displacement current flows when the overall length of the signal differs from the overall length of the conductive return-current path by more than a previously defined limit based on the signal transition time.

5 Claims, 7 Drawing Sheets

AUTOMATIC VERIFICATION OF ADEQUATE CONDUCTIVE RETURN-CURRENT PATHS

CROSS-REFERENCE TO RELATED APPLICATIONS

This application is related to U.S. application Ser. No. 11/866,591 filed Oct. 3, 2007, the complete disclosure of which, in its entirety, is herein incorporated by reference.

BACKGROUND

Field of the Invention

This invention generally relates to electronic circuits and their design and more particularly to a method and system that assesses whether the shortest conductive return paths that are found within a given network of wiring are adequate.

SUMMARY

A coaxial cable is recognized as one of the best ways of transmitting an electromagnetic signal from one point to another while maintaining excellent signal integrity and low electromagnetic emissions. A central conductor provides a pathway for the signal current, and the surrounding shield (which completely and symmetrically encloses the central conductor and an intervening dielectric layer) provides a uniform, conductive "reference net" enclosure, thereby minimizing field distortions and impedance discontinuities, both of which can degrade the integrity of the signal being transmitted. The conductive reference net provides a symmetric plurality of conductive return paths for the signal return current. The outer shield also contains electromagnetic emissions, which can couple to other signal wires and adversely affect their signaling function. Stripline has many of the same beneficial attributes as coaxial cable. A stripline is comprised of a conductive wire having a rectangular cross section sandwiched between conductive planes above and below with intervening dielectric layers between the signal wire and the planes. The planes are often called "reference planes" and must be large relative to the cross section of the signal wire to provide beneficial effect. The reference planes contain the electromagnetic fields of the signaling current and are a conductive reference net for the signal net, providing a plurality of conductive return paths for the signal return current.

The electrical benefits of coaxial cables and striplines are offset by the fact that their geometries require significant additional space beyond that taken by a signal wire alone. Microelectronic products can rarely afford these extra space demands. Instead, signal wires are packed tightly with little in the way of shields or reference nets for the signals, which would otherwise provide continuous conductive return paths for the signal return currents. Coupling is tolerated within certain limits (and can be estimated with text book equations in conjunction with 2D capacitance and inductance simulations). But the detrimental effects of discontinuous conductive return-current paths are much more difficult to quantify, and are only observable in electrically large structures (in which the signal transition time is faster than the round trip flight time of the signal across the structure and back). Lacking any means other than visual inspection of finding the shortest conductive return-current path for a signal net, or assessing whether that return-current path is adequate, designers of circuit cards and microelectronic packages routinely follow simple layout guidelines such as "Do not run a signal wire over the gap between two reference planes." Such guidelines specify action in the absence of knowledge that there is a real problem, and also lack any means of quantifying the extent of any real problem.

Microelectronic chips, packages, and cards use wires and vias to conduct signal currents from one location to another. These elements are collectively called a "signal net". Wires, vias, and plane structures are also used to conduct power supply currents. These elements are collectively called "power-supply networks," or more generically, "reference structures" or "reference nets". For optimal signal integrity and electromagnetic emissions suppression, reference structures should be proximally positioned with the signal nets, separated only by a thin dielectric, as in a coaxial cable. But manufacturing constraints require that there be minimum spacings between vias, and between wires and vias. Moreover, the signal requirements of real products typically result in dense clusters of signal nets, with reference structures such as vias and planes pushed away to more distant portions of the chip, package, or circuit board.

In electronic circuits, currents flow in closed loops. Typically, signal currents flow on dedicated conductive signal wires and vias, and return currents (which complete each current loop) flow on conductive power-supply networks that fill the space around signal wires and vias with geometrically complicated 3-dimensional structures. Return currents diffuse through the power-supply networks under the impetus of voltage gradients.

Typically, there are many conductive paths through a reference structure that a given return current can follow. Achieving good signal integrity requires that a continuous conductive return-current path closely follows each signal net. Determining whether a particular electronic design achieves this goal within acceptable margins requires the identification for each signal net of the return path that most closely follows the signal net among a plurality of possible conductive return-current paths.

How far can reference structures be removed from a signal net while still maintaining acceptable signal integrity? Stated alternately, how much can the ideal coaxial cable or stripline geometry be distorted before signal integrity is unacceptably degraded? These are topics addressed by this invention.

In view of the foregoing, the present embodiments provide a method, system, computer program product, etc. that evaluates reference nets with respect to signal nets within a three-dimensional circuit design to determine which of the reference nets adequately carry signal return currents, thereby preserving signal integrity. The method has three general steps. For each signal net, the method identifies reference nets that carry significant return current. The method then identifies the shortest conductive return-current path through each significant reference net. Lastly, the method determines if each shortest conductive return-current path is adequate. More specifically, for each signal net, the method finds the reference nets that carry significant signal return current. These are reference nets that are proximal to the signal net for more than a previously defined limit based on the transition time (RISET) of the signal. Alternately, a reference net may be specified as a required reference net for the signal net (with the REFABOVE or REFBELOW keywords, for example). Thus, the embodiments herein evaluate reference nets within a three-dimensional circuit design to determine which of the reference nets are proximal to a signal net for more than a predetermined minimum distance (based on the transition time of the signal net), or interpret keyword specifications, to identify "significant" reference nets. The reference nets are typically comprised of wire, via, and plane conductors.

For each significant reference net of each signal net, the method finds the shortest conductive return-current path for the signal through the reference net using the tracing method. The method analyzes each shortest conductive return-current path and determines if a significant portion of the signal return current flows as displacement current (i.e., as electromagnetic fields) rather than following the shortest conductive current path. A significant displacement current flows when the length of the conductive return-current path that diverges from a signal net is more than a previously defined limit based on the signal transition time, RISET. Further, a significant displacement current flows when the overall length of the signal differs from the overall length of the conductive return path by more than a previously defined limit based on RISET.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
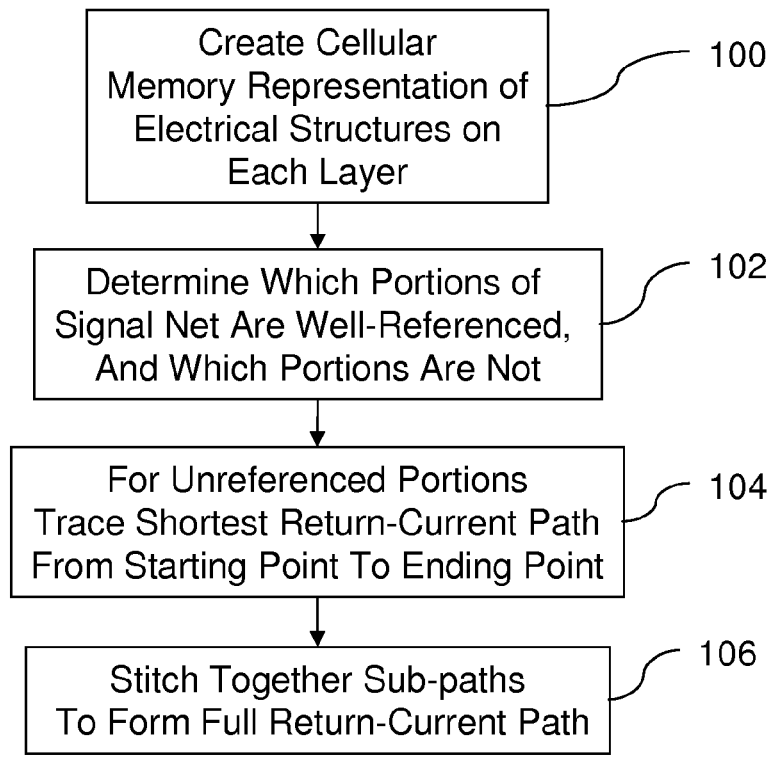
FIG. 1 is a flow diagram illustrating a method embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Distorting an ideal coaxial or stripline geometry in ways that lengthen or break a conductive return-current path can result in return current flowing as "displacement" current. Ordinary (or conduction) current is comprised of charged particles, such as electrons, flowing through conductive material to complete a circuit loop. Displacement current, in contrast, flows when an electric circuit is completed by electromagnetic fields across free space (across insulators). Displacement current has at least three detrimental effects in electronic systems. First, signal integrity is impacted. The magnitude of this impact is proportional to the amount of displacement current and the "cavity impedance" through which it flows. In stripline structures, the cavity impedance is directly proportional to the dielectric thickness. The duration of the impact is proportional to the round trip delay to the closest conductive return-current path. (It follows from this last point that signal nets having very long transition times are not functionally impacted by displacement current). Second, power-supply integrity is impacted. Displacement current transfers energy from the signaling portion of an electronic system to the power-supply portion of the system, creating noise on the power supply which can affect other signal nets in the system. Third, displacement current (by definition) flows by way of transient electromagnetic fields in free space. If these fields are not contained, then electromagnetic emissions from the electronic system will increase when displacement current flows.

The invention uses a method for quickly tracing minimum-length electrically conductive signal return-current paths through multi-layered circuit packages (this method works for chips, packages, boards, or any electronic structure). It utilizes a raster based (cellular) memory model comprising individual grids for each package layer. Each grid comprises a reduced resolution N×M cell representation of the conductive structures on that layer. Cellular methodologies are then used to determine, for each signal net, the shortest conductive return-current path through each significant reference net. This information can then be used for various purposes, including determining if each reference net is sufficient to ensure adequate signal integrity. Some advantages of this method are simplicity and speed. The cellular nature of the methodology allows for a decomposition of the problem into a series of relatively straightforward steps, each of which can be made to execute very efficiently.

The invention comprises a fast and rigorous method for determining when a reference net is not sufficient to ensure that signal return currents flow as conduction current rather than displacement current. Typical run times for the inventive method on today's typical desk-top computer are about 90 seconds for a product package having many hundreds of signal nets. In contrast, extraction and analog simulation to look for the effects of inadequate signal return-current paths typically requires several hours of run time for just a few signal nets.

The methods disclosed herein provide a simple and efficient solution to a conceptually difficult problem which would otherwise require net simulation. If an acceptable signal return-current path does not exist, this method discovers that fact quickly.

As shown in flowchart form in FIG. 1, the invention creates a cellular memory representation of the electrical structures on each layer (wires, pins, vias, power planes, etc.) of the multi-layered circuit design as shown in item 100. This divides each of the layers of the multi-layered circuit into a grid of cells. In item 102, for each signal net (group of connected conductive structures in the circuit design) whose return-current path is to be traced through a given reference net (e.g., GND), the method determines which portions of the signal net are well-referenced, and which portions are not well-referenced. Most signal nets are positioned above, below, or between power-supply layers or planes, and a portion of a signal net is considered well-referenced if the adjacent power-supply layer has conductors in the region directly above or below that portion of the net. Therefore, in "well-referenced" portions of signal nets, the power-supply conductors on the layer directly above or below that portion of the signal net are proximal to the signal wires, making the conductive reference net proximal to the signal net. However, such is not always the case in typical microelectronic structures and many of the portions of each of the signal nets will not be well-referenced. Portions of signal nets that are not well referenced are henceforth designated as "unreferenced" in this application.

A reference net is typically a complicated 3-dimensional structure. There are many potential conductive return-current paths through a given reference net. For any given signal net that is near such a reference net, there is only one shortest conductive signal return-current path. In item 104, for each unreferenced portion of a signal net, the invention traces the shortest return-current path or sub-path (through the reference conductors) from its starting point to its ending point. To the contrary, each well-referenced portion of a signal net cannot be improved upon because it already has a proximal conductive return-current path as short as possible, and such proximal return-current paths of well-referenced portions of signal nets will be used to the fullest extent that they are available as sub-paths of the overall shortest conductive signal return-current path that is arrived upon by the invention. In other words, for each portion of each signal net that is well-referenced, the method identifies the proximal conductors in the reference structures (typically power-supply planes) as the shortest reference net.

Thus, each conductive signal return-current path will have multiple sub-paths, alternating between well-referenced sections of the signal net, and the unreferenced "excursions" from the signal net traced in item 104. Each sub-path may comprise multiple horizontal and vertical segments. Each sub-path of an unreferenced section (called an "excursion"), can be determined, for example, through a stepwise cellular expansion process (cell-by-cell process) that is discussed in greater detail below with respect to FIG. 3. In item 106, the invention stitches together (combines) the shortest conductive return-current path of each cell within the cellular representation to identify the shortest electrically conductive return-current path for each signal net.

Figure 2:
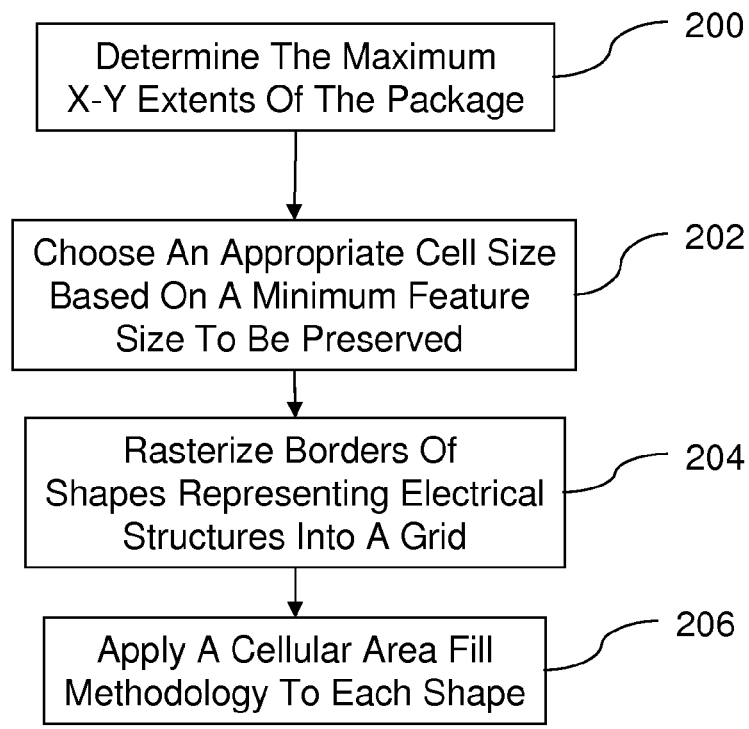
FIG. 2 is a flow diagram illustrating a method embodiment of the invention.

More specifically, the processing in item 100 is shown in greater detail in flowchart form in FIG. 2. As mentioned above, in item 100, for each layer of the package (or chip, board or electronic structure) to be analyzed, the method creates a cellular memory representation of the electrical structures on that layer (wires, pins, vias, power planes, etc.). Thus, in item 200, the method determines the maximum X-Y extents of the package (chip, board or electronic structure). In item 202, the method chooses an appropriate cell size (granularity), based on a minimum feature size to be preserved (e.g., minimum wire separation). In item 204, the method rasterizes the borders of the shapes representing the electrical structures into the grid (including voids). In the grid, each cell intersected by a border line will contain information identifying which net it belongs to, in addition to other information. Then, in item 206, the method can apply a cellular area fill methodology to each shape to convert it from a boundary representation to a region of contiguous cells. In item 206, the net and other information are propagated from the boundary cells to the interior cells.

Figure 3:
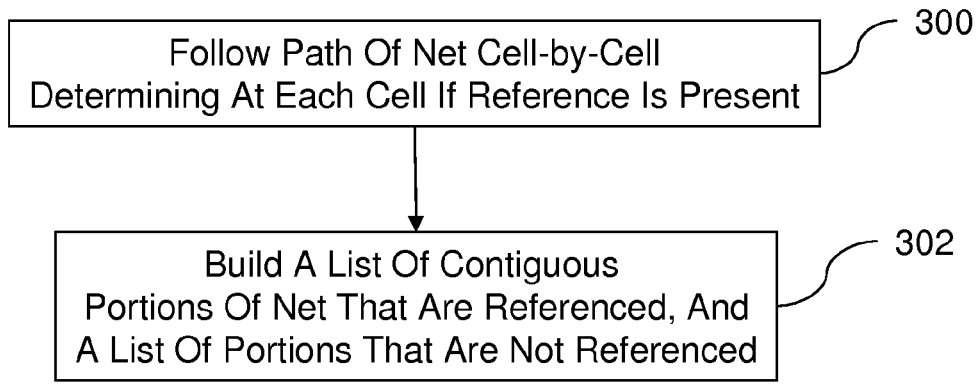
FIG. 3 is a flow diagram illustrating a method embodiment of the invention.

FIG. 3 illustrates the processing of item 102 is greater detail. As discussed above, in item 102, for each signal net whose return-current path is to be traced with respect to a given reference net (e.g., GND), the method determines which portions of the net are well-referenced, and which portions are not. The reference net may be above or below the signal net, and may vary from above to below, and vice-versa, within the same signal net. Thus, in item 300, beginning at one end of a signal net, the method follows the path of the net cell-by-cell, determining at each cell if reference is present. In item 302, the method builds a list of contiguous portions of the signal net that are referenced, and a list of portions that are not well referenced. The union of these lists is the entire signal net. In item 300, short, isolated sections of reference can be ignored, in order to improve the solution (e.g. in one embodiment, "short" is defined as less than the distance the signal wave front can travel in 3% of the signal's electrical transition time). Each section in the lists may span multiple layers of the electronic structure.

Figure 4:
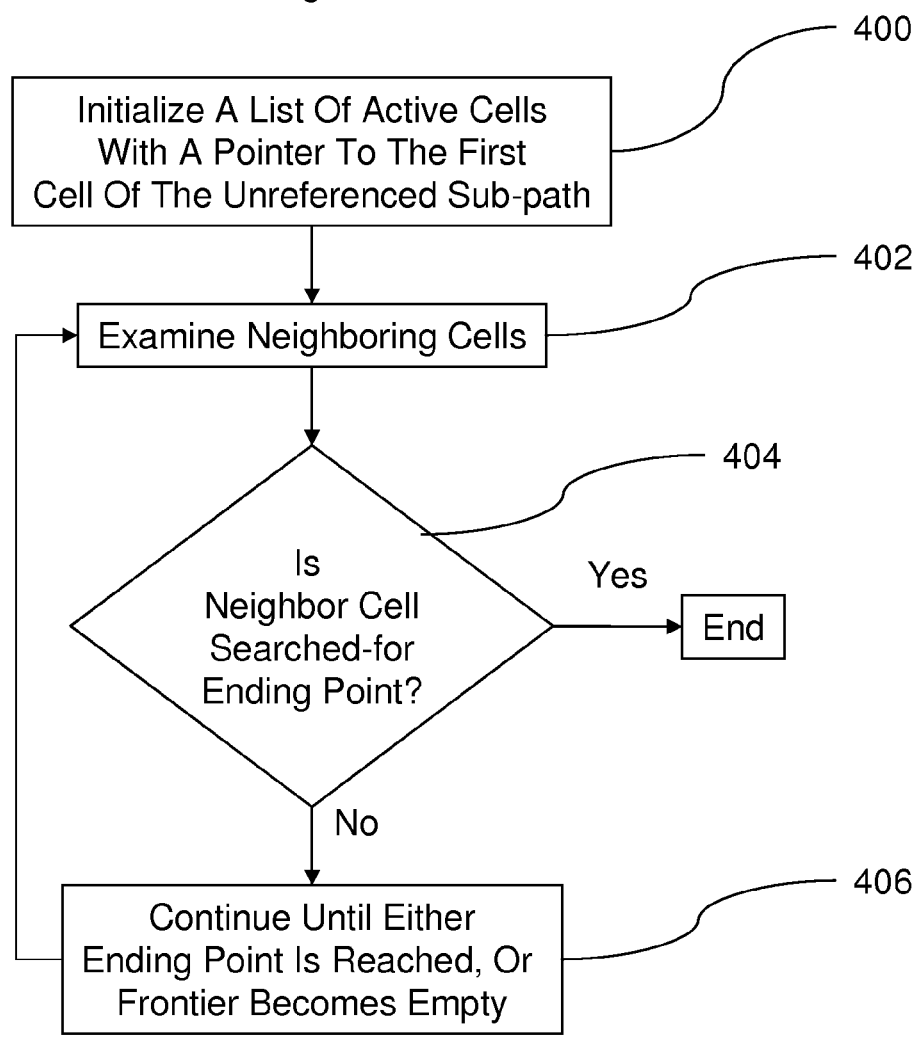
FIG. 4 is a flow diagram illustrating a method embodiment of the invention.

FIG. 4 illustrates item 104 in greater detail. As mentioned above, in item 104, for each unreferenced portion of the signal net, the method traces the shortest path or sub-path (through the reference conductors) from its starting point to its ending point. This sub-path (called an "excursion") is determined through a stepwise expansion of the initial cell, remaining always within the reference conductor regions, until the ending point is reached. This is similar to the process used by maze running algorithms. The motivation here is to find the best (shortest) conductive path that the return current can follow to get from the point at which reference is lost to the point where it is regained.

As shown in FIG. 4, this process initializes a list of active cells (the "frontier") with a pointer to the first cell of the unreferenced sub-path in item 400. In item 402, the method examines the neighboring cells. In item 402, for each neighbor cell that belongs to the reference net, and has not yet been visited, the method marks the cell as visited, and adds the cell to the frontier. In addition, in item 402, the method adds directional information indicating the cell's predecessor. This information has several uses, including the extraction of the sub-path once the ending point has been reached.

A cell's neighbors are the eight cells immediately adjacent to it. For vertical structures (vias, pins, etc.), the cells above and below are also neighbors. In item 404, if a neighbor cell is the searched-for ending point, the process is complete, otherwise processing proceeds to item 406. The shortest sub-path can be determined by retracing the cells that led to it by using the directional information stored in each cell. The method takes the next cell from the frontier, and repeats the process beginning with item 402 as shown by the arrow from 406 to 402. This process continues, removing cells from one end of the frontier, and adding them to the other, until either the ending point is reached, or the frontier becomes empty (meaning that no path exists), as shown by item 406. The search process can be thought of as a uniformly expanding bubble that will eventually make contact with the searched-for ending point. This first contact indicates the shortest path from starting point to ending point.

The foregoing expansion from neighbor cell to neighbor cell is three-dimensional, because via cells allow cells in neighboring layers to be added to the fringe. Because expansion is restricted to conductors of the reference net, paths can be traced around obstacles (including voids), and from layer to layer through vias until the ending point is found.

After finding the shortest conductive return-current path for each signal using the technique described above, the invention then assesses whether each conductive return-current path is adequate, as detailed in FIGS. 5-7, described below. In the following discussion, a "non-excursion path" is a path along the reference structure (or net) in question that is proximal with (mirrors) the signal net; and an "excursion path" is a path along the reference net in question that is divergent from (is not proximal to) the signal net. The term "RISET" is the electrical transition time of the voltage of a signal net; the term "REFABOVE" is a specification for the name of a first reference net above a signal net (typically a conductive plane); the term "REFBELOW" is a specification for the name of a second reference net below a signal net.

Figure 5:
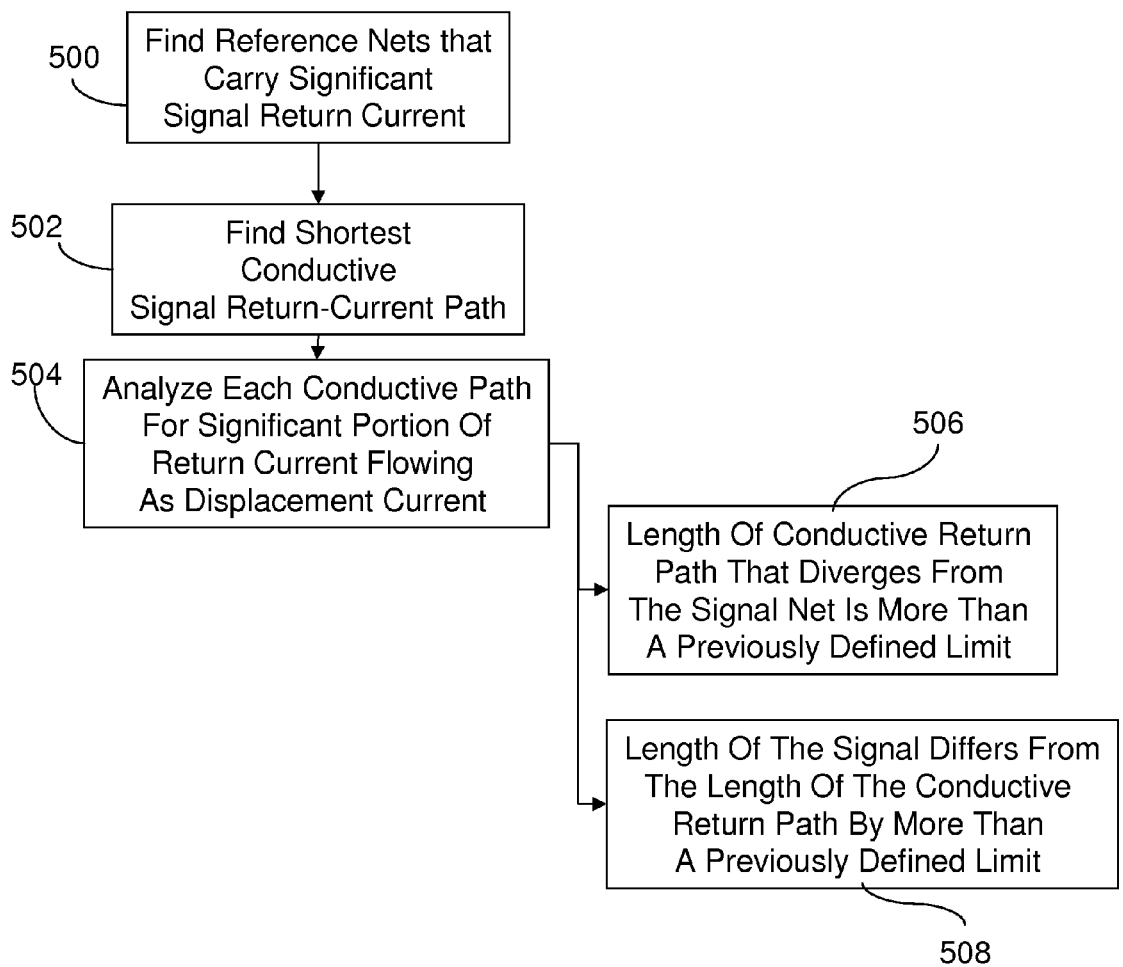
FIG. 5 is a flow diagram illustrating a method embodiment of the invention.

The method has three general steps as shown in FIG. 5. More specifically, in item 500, for each signal net, the method finds the reference nets that carry significant signal return current. These are reference nets that are proximal to a signal net for more than a previously defined limit based on the transition time (RISET) of the signal net, or which have been specified as required reference nets for the signal net (with the REFABOVE or REFBELOW keywords, for example). Thus, the embodiments herein evaluate reference nets within a three-dimensional circuit design to determine which of the reference nets are proximal to a signal net for more than a predetermined minimum distance (based on the transition time of the signal net) to identify "significant" reference nets. The reference nets are typically comprised of wire, via, and plane conductors.

In item 502, for each reference net of each signal net, the method finds the shortest conductive return-current path for the signal net using the tracing method described in FIGS. 1-4 above. In item 504, the method analyzes each conductive return-current path and determines if a significant portion of the signal return current flows as displacement current rather than following a conductive current path. The processing in item 504 is shown in greater detail in FIG. 6, discussed below.

In item 504, a significant displacement current flows when the length of the conductive return-current path that diverges from a signal net is more than a previously defined limit based on the signal net transition time, RISET, as shown in item 506. Further, a significant displacement current flows when the overall length of the signal net differs from the overall length of the conductive return-current path by more than a previously defined limit based on RISET, as shown in item 508.

Some points to consider are that direct current (DC) nets do not create transient return currents and so they do not need to be checked for an adequate conductive signal return-current path. Further, electrically short signal nets cannot generate significant return currents in the package and so they do not need to be checked for an adequate conductive signal return-current path. "Electrically short" for the purposes of this disclosure is defined as less than the distance a signal wave front would travel in some fraction (e.g., 40%) of the signal net transition time, RISET. This fraction can be determined empirically using known-good packages, or by way of detailed simulation of known-good packages.

Similarly, reference nets that interact with a signal net for only electrically short distances do not carry significant return currents and so they are not considered references for the signal net in question. Additionally, small, distantly extended portions of a reference net can not carry significant return current. These are defined as being small enough that the flight time across them is less than some limit, such as 3% of RISET. Such small, distantly extended portions of reference nets are omitted as attraction points for reference net tracing.

The specification of REFABOVE or REFBELOW for a signal net should force reference net tracing on the specified power-supply net regardless of its size. This is because it may be desired to have continuity between circuit board and electronic package reference nets.

Figure 6:
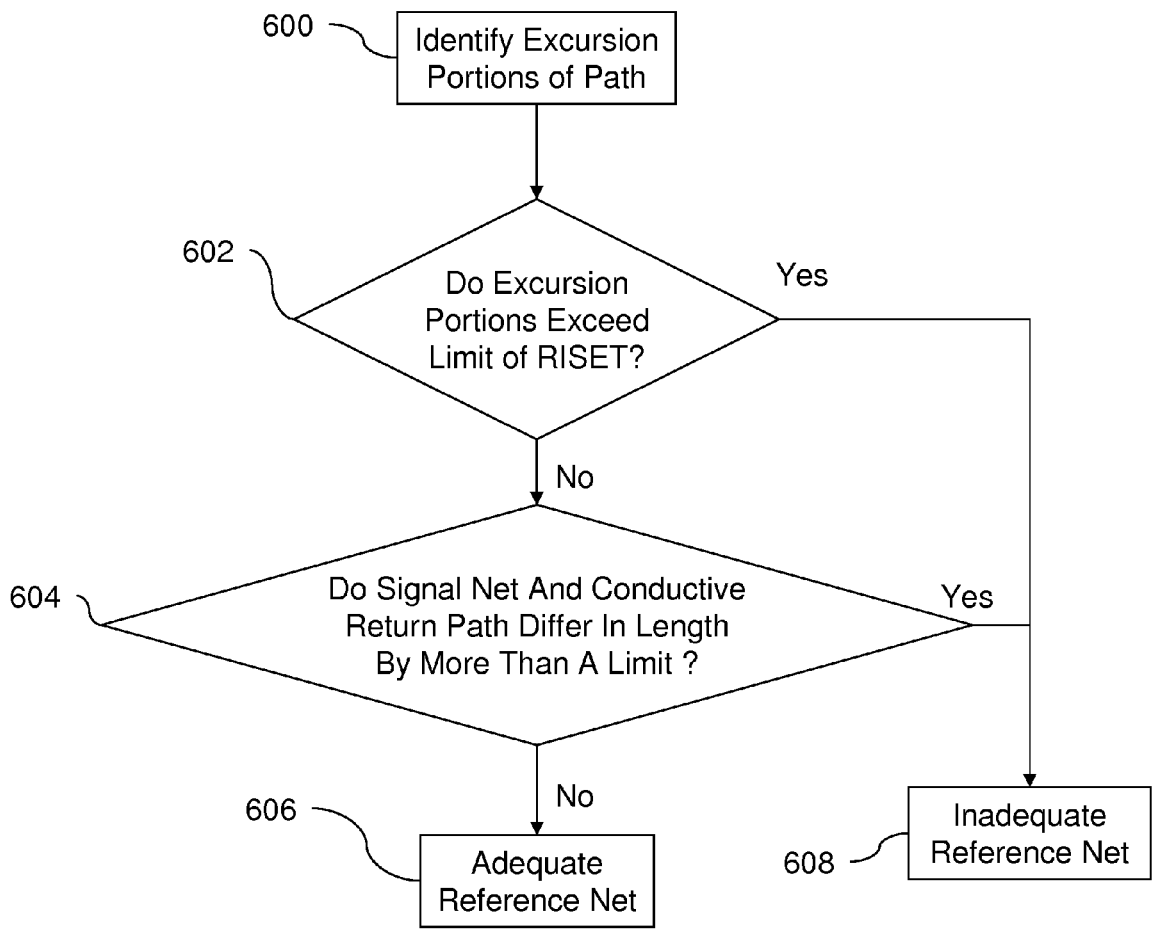
FIG. 6 is a flow diagram illustrating a method embodiment of the invention.
Figure 7:
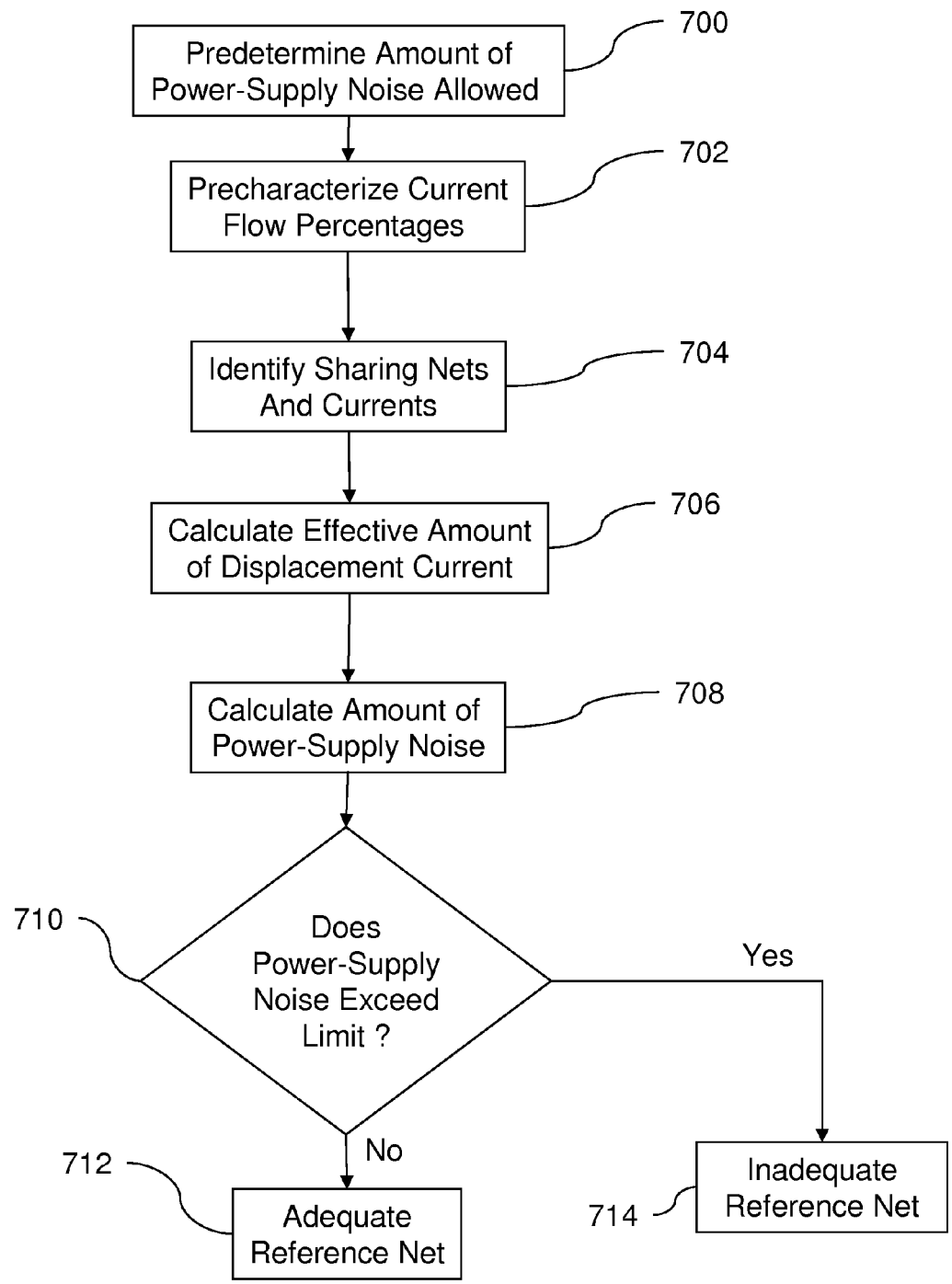
FIG. 7 is a flow diagram illustrating a method embodiment of the invention.

Referring now to FIG. 6, which details the processing in item 504, the processing identifies in item 600 all "excursion" portions of the shortest conductive signal return-current path (those not proximal to the signal net). In item 602, if the excursion path segments of a shortest conductive signal return-current path have a length that exceeds a predetermined limit (e.g., greater than the distance the signal wave front would travel in 40% of RISET), the reference net provides an inadequate conductive signal return-current path.

In item 604, if the signal net and conductive signal return-current path differ in overall length by more than a predetermined limit (e.g., the distance the signal wave front would travel in 40% of RISET) again the signal net has an inadequate conductive return-current path and the reference net is labeled inadequate in item 608. Otherwise, the signal net is considered to have an adequate conductive reference net, in item 606.

As noted above, some of the percentage limits are set at 40%. However, one ordinarily skilled in the art would understand that such limits can vary depending upon the specific circuit design in question, and can comprise any limit greater than 0%. The limit used above is defined as follows:

$$\text{Limit (um)} = ((\text{net length (um)})/(\text{net delay (ps)})) * k * \text{RISET (ps)}$$

In the above, k is typically a constant. The value of k in one embodiment of the invention is set to 0.4; however, this could be any appropriate value greater than 0, depending upon the circuit in question. Note that the limit is a function of the transition time of the signal whose reference net is being assessed. Net delay may be calculated in a variety of ways, or measured. The quantity (net length/net delay) is the inverse of unit delay and has units of um/ps.

It is electrically best to have a dedicated conductive reference net for every signal net. But in real-world electronic systems, which typically demand a high density of signal nets, portions of a given conductive reference net may be shared by two or more signal nets. In an additional embodiment of this invention shown in FIG. 7, an assessment is made whether or not such reference net sharing results in displacement current to an unacceptable extent. As shown in item 700, this embodiment predetermines the amount of power-supply noise that will be allowed on each layer of the chip, package, or circuit board (power-supply noise caused by displacement current is proportional to dielectric thickness). Then, for each dielectric layer thickness, in item 702, the method pre-characterizes what percentage of current flows as displacement current and what percentage flows as conduction current as a function of conductive signal return-current path length out and back from a signal via. Note that in this situation, the percentage of total current that flows as displacement current is a function of the signal transition time.

In item 704, for each shared reference net portion, the method identifies the signal nets that share the portion and the amount of current they each conduct. In item 706, for each shared reference net portion, the method calculates the effective amount of displacement current that flows through a dielectric layer based on the number of signal nets sharing the portion and the distances of their respective conductive return paths. In item 708, for each shared reference net portion, the method calculates the amount of power-supply noise that results from displacement current flowing through a dielectric layer. In item 710, for each shared reference net portion, if the calculated power-supply noise voltage exceeds the predefined limit for a dielectric layer, the method identifies the reference net portion as being inadequate in item 714. Otherwise, the reference net is considered adequate (item 712).

Figure 8:
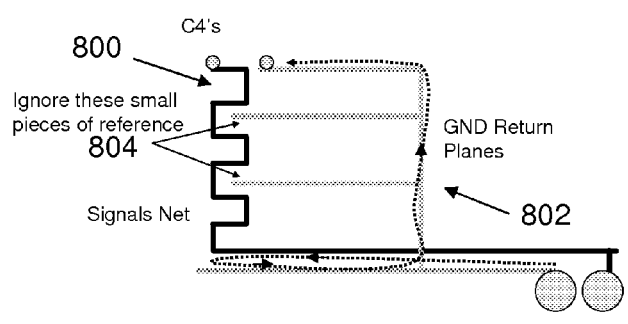
FIG. 8 is schematic diagram illustrating a circuit diagram.
Figure 9:
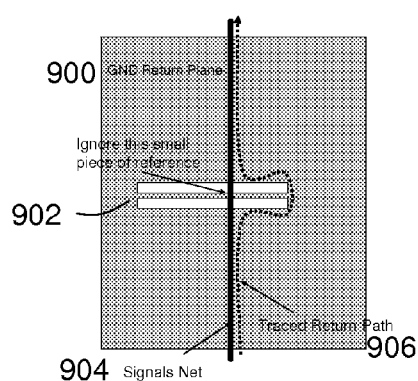
FIG. 9 is schematic diagram illustrating a circuit diagram.
Figure 10:
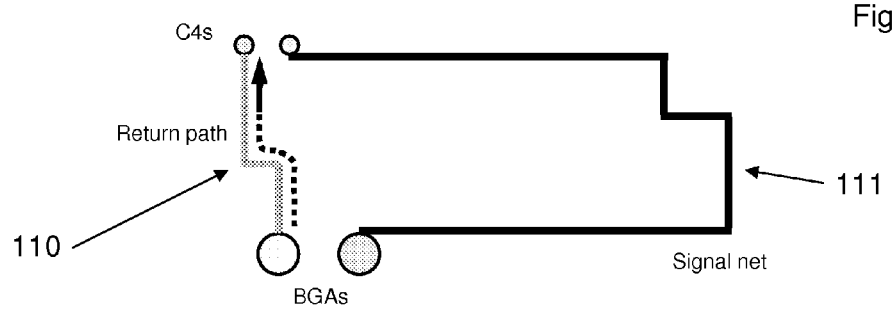
FIG. 10 is schematic diagram illustrating a circuit diagram.

FIGS. 8-10 illustrate many of the concepts discussed above. For example, FIG. 8 illustrates a cross-sectional view of a signal net 800 running vertically through a three-dimensional circuit design having multiple layers of circuitry. The signal net 800 runs from a lower ball of a ball grid array (BGA's) in a stair-step fashion through vias up to a ball in an array of balls (C4's) on an upper package layer. The reference net is shown as item 802. In FIG. 8, the method ignores excursions 804 of the reference net that are very small (below a predetermined distance limit based on rise time, RISET (e.g., 3% of RISET or less)). Similarly, FIG. 9 illustrates a top (plan) view of a reference plane 900 where the signal net 904 goes over twin gaps 902 in the reference plane 900 (and the shortest conductive signal return-current path 906 goes around). Again, if the conductor between the twin gaps in the reference plane 900 is small enough (below a predetermined distance limit based on RISET), it can be ignored when determining the shortest conductive signal return-current path 906. FIG. 10 illustrates the concept where a shortest conductive signal return-current path 110 has an overall length that is less than the length of the signal net 111 by more than a predetermined limit based on the signal transition time, RISET. The reference net would thereby be considered inadequate in item 604.

The embodiments of the invention can take the form of an entirely hardware embodiment, an entirely software embodiment or an embodiment including both hardware and software elements. In a preferred embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 11:
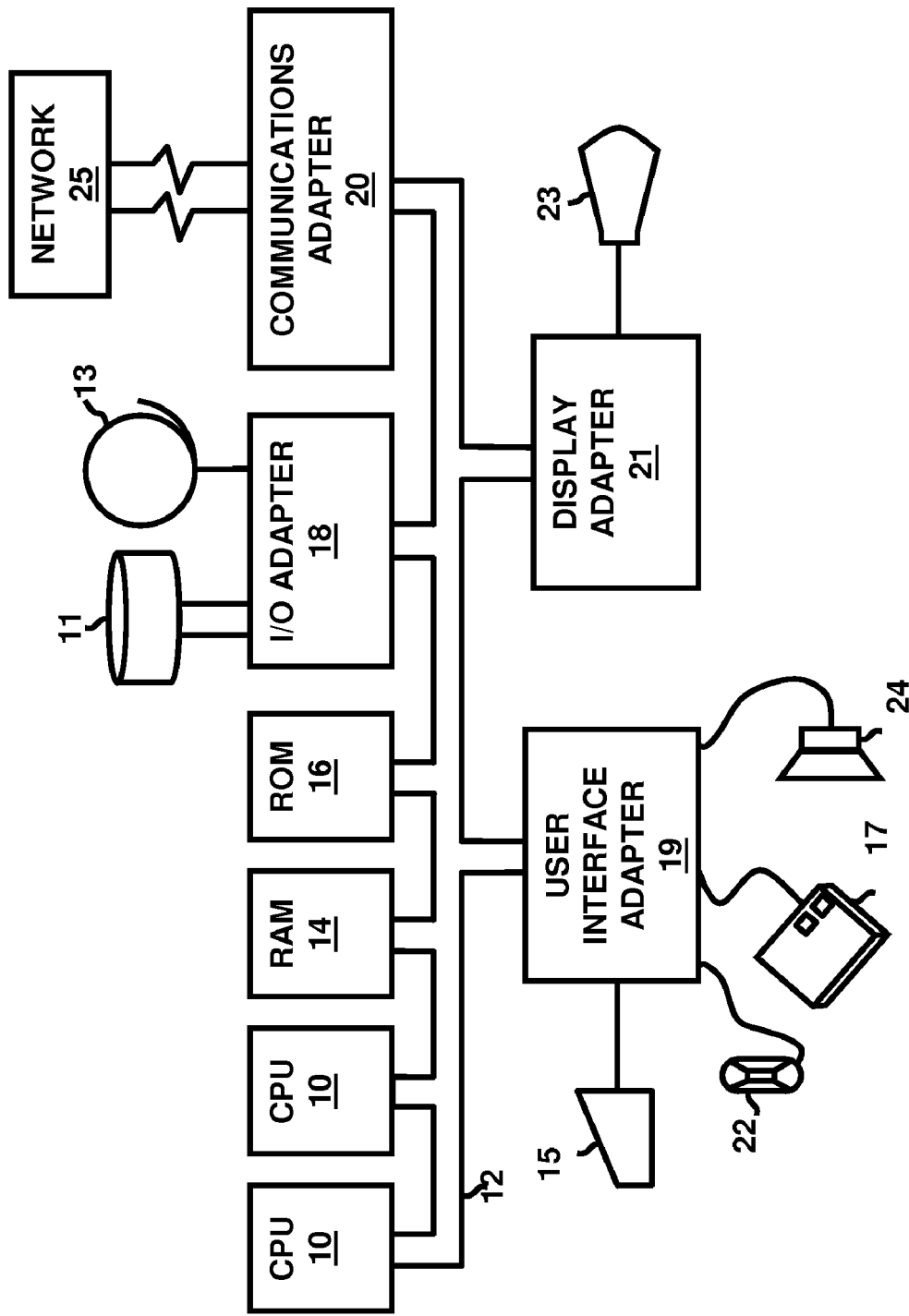
FIG. 11 is schematic diagram illustrating a system embodiment of the invention.

A representative hardware environment for practicing the embodiments of the invention is depicted in FIG. 11. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

Thus, as mentioned above, there are many conductive paths that a given return current can follow. Achieving good signal integrity requires that continuous conductive return paths closely follow each signal net. The first step in determining whether a particular electronic design achieves this goal within acceptable margins is identifying for each signal net the return-current path that most closely follows the signal net among a plurality of possible conductive return-current paths for each reference net of said signal net. Once the shortest or group of shortest conductive signal return-current paths are found, the invention determines whether such paths are adequate to ensure that return currents flow as conduction current rather than displacement current. The invention comprises a fast and rigorous method for determining when a reference net is not sufficient to ensure that return currents flow as conduction current rather than displacement current. Layout extraction and analog simulation on a net by net basis can be done to look for the effects of inadequate reference nets. Typical run times for the inventive method on today's typical desktop computer are about 90 seconds for a product package having many hundreds of signal nets. In contrast, extraction and analog simulation typically require several hours of run time for just a few signal nets.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A computer-implemented method comprising:

evaluating, using a computer, reference nets within a three-dimensional circuit design to determine which of said reference nets are proximal to signal nets for more than a predetermined distance to identify significant reference nets;

determining, using said computer, the shortest conductive signal return-current path through each significant reference net; and analyzing, using said computer, said shortest conductive signal return-current path to determine whether said shortest conductive signal return-current path is adequate based on whether reference net sharing results in displacement current exceeding a predetermined limit, wherein said analyzing of said shortest conductive signal return-current path comprises determining whether signal return current flows as displacement current rather than conduction current, and wherein said reference net sharing occurs when different signal nets share portions of said shortest conductive signal return-current path.

2. The method according to claim 1, wherein said displacement current comprises additional current each additional signal net adds to shared portions of said shortest conductive signal return-current path.

3. The method according to claim 2, further comprising identifying, using said computer, a reference net portion as being in error if a calculated power-supply noise voltage resulting from said displacement current exceeds a predefined limit for a dielectric layer.

4. The method according to claim 1, wherein said analyzing further comprises determining, using said computer, what portions of said shortest conductive signal return-current path comprise excursion portions and what portions of said shortest conductive signal return-current path comprise non-excursion portions.

5. A computer program product comprising a non-transitory computer readable medium tangibly embodying instructions executable by a computer to perform a method comprising:

evaluating reference nets within a three-dimensional circuit design to determine which of said reference nets are proximal to signal nets for more than a predetermined distance to identify significant reference nets;

determining the shortest conductive signal return-current path through each significant reference net; and analyzing said shortest conductive signal return-current path to determine whether said shortest conductive signal return-current path is adequate based on whether reference net sharing results in displacement current exceeding a predetermined limit, wherein said analyzing of said shortest conductive signal return-current path comprises determining whether signal return current flows as displacement current rather than conduction current, and wherein said reference net sharing occurs when different signal nets share portions of said shortest conductive signal return-current path.

* * * * *